United States Patent [19]

Jordy et al.

[11] Patent Number: 4,675,846

[45] Date of Patent: Jun. 23, 1987

[54] RANDOM ACCESS MEMORY

[75] Inventors: George J. Jordy, Wappingers Falls; Joseph M. Mosley, Hopewell Junction, both of N.Y.

[73] Assignee: International Business Machines Corporation, Armonk, N.Y.

[21] Appl. No.: 682,388

[22] Filed: Dec. 17, 1984

[51] Int. Cl.⁴ .............................................. G11C 11/40
[52] U.S. Cl. .................................... 365/174; 365/189
[58] Field of Search ........................................ 365/174

[56] References Cited

U.S. PATENT DOCUMENTS

| | | | |
|---|---|---|---|
| 3,510,856 | 5/1970 | Cline | 340/174 |
| 3,848,236 | 11/1974 | Troutman | 340/173 |
| 4,092,551 | 5/1978 | Howard et al. | 307/254 |
| 4,319,344 | 3/1982 | Heuber et al. | 365/203 |
| 4,321,490 | 3/1982 | Bechdolt | 307/456 |
| 4,330,723 | 5/1982 | Griffith | 307/456 |
| 4,366,558 | 12/1982 | Homma et al. | 365/189 |

Primary Examiner—Terrell W. Fears
Attorney, Agent, or Firm—Wesley DeBruin

[57] ABSTRACT

A bipolar random access memory array including "end of write shut down circuit means" coupled to the write circuit means is disclosed. The "end of write shut down circuit means" is activated by and only functions as the written cell switches state. The "end of write circuit means" is coupled between the opposite bit line and preferably the write transistor of a write circuit of the write circuit means. The use of "the end of write circuit means" improves the overall operation of the memory and in particular the write operation thereof.

20 Claims, 10 Drawing Figures

COMPLEMENTARY TRANSISTOR SWITCH
(CTS) MEMORY CELL 4,675,846

RANDOM ACCESS MEMORY

BACKGROUND OF THE INVENTION

1. Field of the Invention

The invention relates generally to the field of random access memories and more particularly to improved "write" mode circuitry.

2. Related Applications

U.S. patent application Ser. No. 682,391 (FI9-83-052) "Improved Random Access Memory", filed 12-17-84 by G. J. Jordy and J. M. Mosley and of common assignee herewith. U.S. application Ser. No. 682,391 (FI9-83-052) filed 12-17-84 is incorporated herein by reference thereto fully and to the same extent as though the entire specification and drawings thereof were expressly set-forth herein.

U.S. patent application Ser. No. 625,426 entitled "Improved Gate Array Chip", filed June 28, 1984 by E. F. Culican et al and of common assignee herewith.

3. Background and Prior Art

In many prior art random access memory arrays the selected cell to be written is brought into the selected state by the proper voltages on its word/drain lines and first/second bit lines. It is known that maintaining a high voltage state on the selected first or second bit line for an indeterminate time can cause disturb conditions in subsequently selected cells. The prior art has addressed this problem in a variety of ways, each of which has its own drawbacks. One method is to use large voltage swings to increase noise immunity. But this requires higher supply voltages and uses more power. Other methods impose timing restrictions which impact performance and place additional burden on the user.

The solution to the problem in accordance with the invention is an improved random access memory which includes the provision of "self-limiting write circuit means".

The prior art includes numerous patents directed to random access memories and more specifically to techniques and circuitry for enhancing the speed and quality of the "write mode".

The following prior art patents are directed to random access memory circuits and related circuitry. It is to be appreciated that the following art is not necessarily the only, the best, or the most pertinent prior art.

U.S. Pat. No. 3,510,856 entitled "Grounding Switches For Differential Sense Amplifiers in Memory Systems" granted May 5, 1970 to J. M. Cline.

U.S. Pat. No. 3,848,236 entitled "Threshold Circuit" granted Nov. 12, 1974 to B. L. Troutman.

U.S. Pat. No. 4,092,551 entitled "A.C. Powered Speed Up Circuit" granted May 30, 1978 to D. D. Howard et al.

U.S. Pat. No. 4,319,344 entitled "Method And Circuit Arrangement For Discharging Bit Line Capacitances of an Integrated Semiconductor Memory" granted Mar. 9, 1982 to K. Heuber et al.

U.S. Pat. No. 4,321,490 entitled "Transistor Logic Output For Reduced Power Consumption And Increased Speed During Low to High Transition" granted Mar. 23, 1982 to R. W. Bechdolt.

U.S. Pat. No. 4,330,723 entitled "Transistor Logic Output Device For Diversion of Miller Current" granted May 18, 1982 to P. J. Griffith.

U.S. Pat. No. 4,366,558 entitled "Memory Device With Fast Word-Line-Discharging-Circuits" granted Dec. 28, 1982 to N. Homma et al.

SUMMARY OF THE INVENTION

The invention may be summarized as a bipolar random access memory array including "end of write shut down circuit means" coupled to the write circuit means. The "end of write shut down circuit means" is activated by and only functions as the written cell switches state. The "end of write circuit means" is coupled between the opposite bit line and preferably the write transistor of a write circuit of the write circuit means. The use of the end of write circuit means improves the overall operation of the memory and in particular the write operation.

There is a write circuit means for each pair of bit lines. Each write circuit means includes a write "1" transistor connected to the first one of the pair of bit lines and a write "0" transistor connected to the second one of the pair of bit lines. The write "1" side of the circuit includes an "end of write circuit" connected to the second bit line of the bit line pair and the write "0" side of the circuit includes an "end of write circuit" connected to the first bit line of the bit line pair. Each "end of write circuit" may be comprised essentially of unilaterally conductive circuit means.

The primary object of the invention is providing an improved random access memory array.

A further primary object of the invention is providing a random access memory whose "write operation" has been significantly enhanced.

A further primary object of the invention is providing a random access read/write memory array having circuit means for anticipating the completion, or near completion, of the write operation and in response thereto promptly terminating the write operation, whereby the operation of the random access memory is materially enhanced.

A further primary object of the invention is to provide an improved random access read/write memory array employing "write complete circuit means" (i.e. "end of write shut down circuit means") and unclamped CTS type memory cells of small area, high stability, low power requirements, high reliability (fewer components) and materially enhanced "write operation" time.

A still further object of the invention is to provide an improved random access read/write memory array employing "write complete circuit means" (i.e. end of write shut down circuit means") and unclamped CTS type memory cells and said array having materially improved "write operation" time and relative immunity to the "alpha particle problem".

The concern over alpha particle sensitivity is fairly recent but a detailed explanation of bipolar RAM sensitivity to alpha particle bombardment can be found in the references set forth below. The modified CTS cell is at least an order of magnitude less sensitive to alpha particle errors than a comparable cell made with the same technology.

References

[1] "Cycle Time Dependence of Soft Errors due to α-rays for Bipolar RAMS," Y. Kato, et al., presented at the National Convention on Semiconductors and Materials (1981), sponsored by Institute of Electronic and Communication Engineers of Japan.

[2] "A 4.5 ns Access Time 1K 4B ECL RAM," J. NoKubo, et al., Digest of ISSCC 1983, p. 112.

[3] "A 15 ns 16 KB ECL RAM with a PNP Load Cell," K. Toyoda, et al., Digest of ISSCC 1983.

[4] "Modelling of Single Event Upset in Bipolar Integrated Circuits," John A. Zoutendyk, IEEE Transaction on Nuclear Science, Vol. NS-30, No. Dec. 6, 1983.

[5] "Soft Error Rates in Static Bipolar RAMS," G. Sai-Halasz and D. D. Tang, IEDM 1983, p. 344.

[6] C. H. Hsieh, P. C. Murley and R. R. O'Brien 19th Annual Proc., Reliability Physics Conf. (Orlando, Fla.), 1981, p. 38.

[7] "Monte Carlo Modeling of the Transport of Ionizing Radiation Created Carriers in Integrated Circuits." G. A. Sai-Halasz and M. R. Wordemann, IEEE Electron Device Lett. Vol. 1, p. 211 (1980).

It is to be appreciated that the practice of applicants invention is not limited to a particular memory cell circuit such as the complementary transistor switch (CTS) memory cell or the unclamped complementary transistor switch (CTS) memory cell. Applicants invention may be practiced with any one of a number of memory cell circuits known to the prior art.

The complementary transistor switch (CTS) memory cell is well known to the art. See for example: (1) U.S. Pat. No. 3,863,229 entitled "SCR (or SCS) Memory Array With Internal and External Load Resistors", granted Jan. 28, 1975 to J. E. Gerbach and of common assignee with the subject application; (2) AC Write Scheme For Bipolar Random-Access Memories Using Schottky Coupled Cells" by J. A. Dorler et al, IBM TDB Vol. 23, No. 11, April 1981; or (3) "A 1024-Byte Random Access Memory Using a Complementary Transistor Switch (CTS) Cell" by J. A. Dorler et al, IBM Journal of Research and Development, Vol. 25, No. 3, May 1981 pages 126-134.

The unclamped complementary transistor switch (CTS) type memory cell is disclosed in the publication "Saturated CTS Memory CEll Using a PNP Load" by J. A. Dorler et al, IBM TDB, February 1984, Vol. 26, No. 9, pages 4720-1.

The foregoing and other objects, features and advantages of the invention will be more apparent from the following more particular description of the preferred embodiment of the invention, as illustrated in the accompanying drawings.

PREFERRED EMBODIMENT

Figure 1:
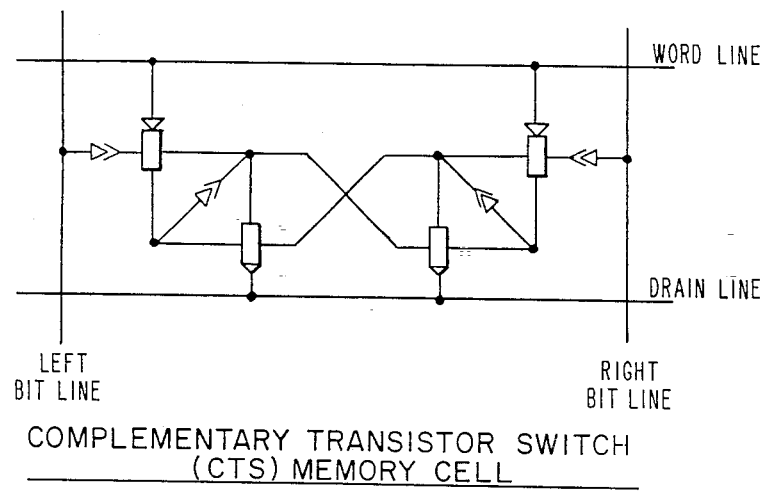
FIG. 1 is a circuit diagram of the well known (prior art) complementary transistor switch (CTS) memory cell.
Figure 2:
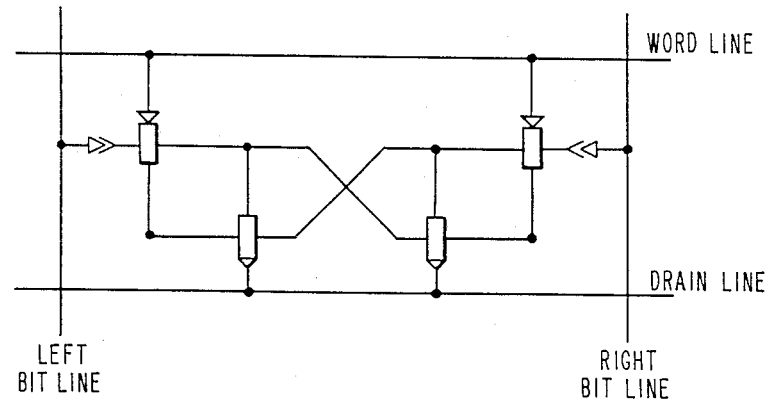
FIG. 2 is a circuit diagram of an unclamped complementary transistor switch (CTS) type memory cell which is employed in the preferred embodiment of the improved random access memory in accordance with the invention.
Figure 3A:
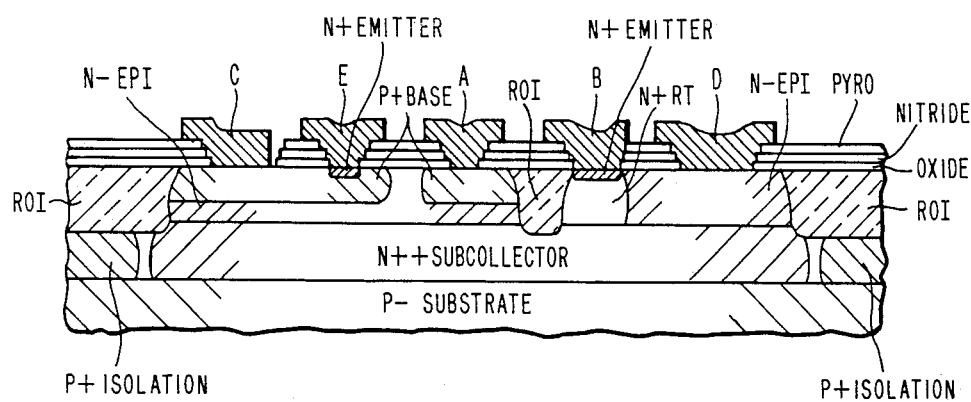
FIGS. 3a and 3b depict a structural layout of a half portion of the unclamped complementary transistor switch (CTS) type memory cell of FIG. 2.
Figure 3B:
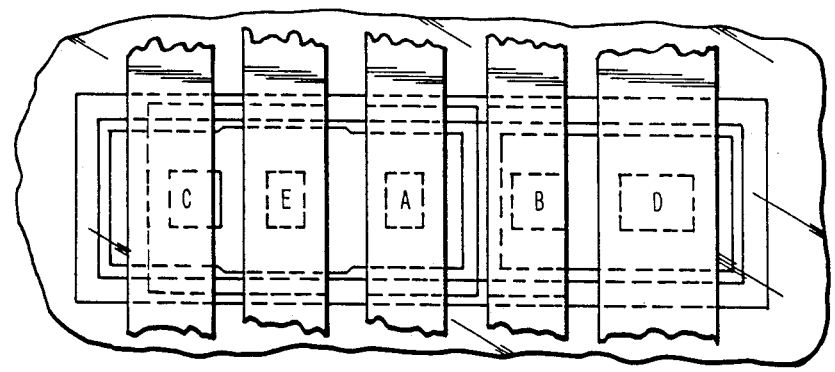
Figure 4:
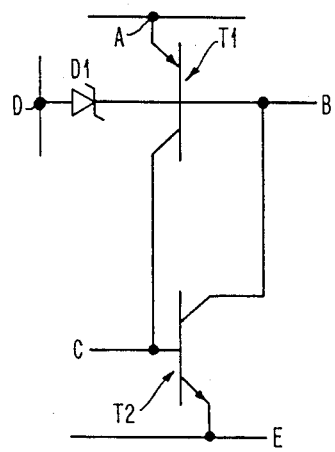
FIG. 4 is a circuit diagram corrsponding to the structural layout of the half portion of the unclamped complementary transistor switch (CTS) type memory cell of FIG. 3.
Figure 5B:
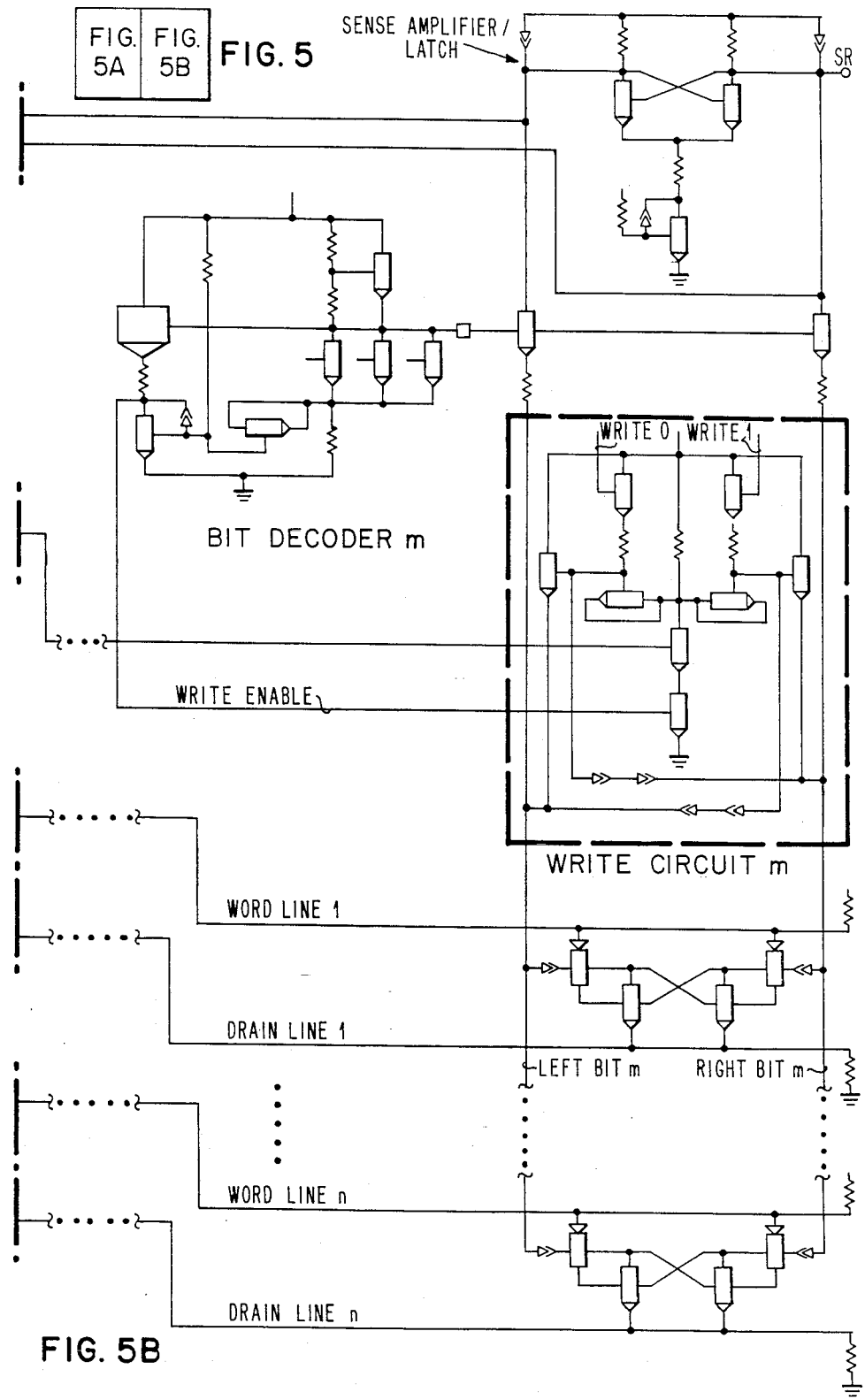
FIG. 5, composed of FIG. 5a and FIG. 5b, is a circuit schematic of a random access read/write memory array in accordance with the preferred embodiment of the invention.
Figure 5A:
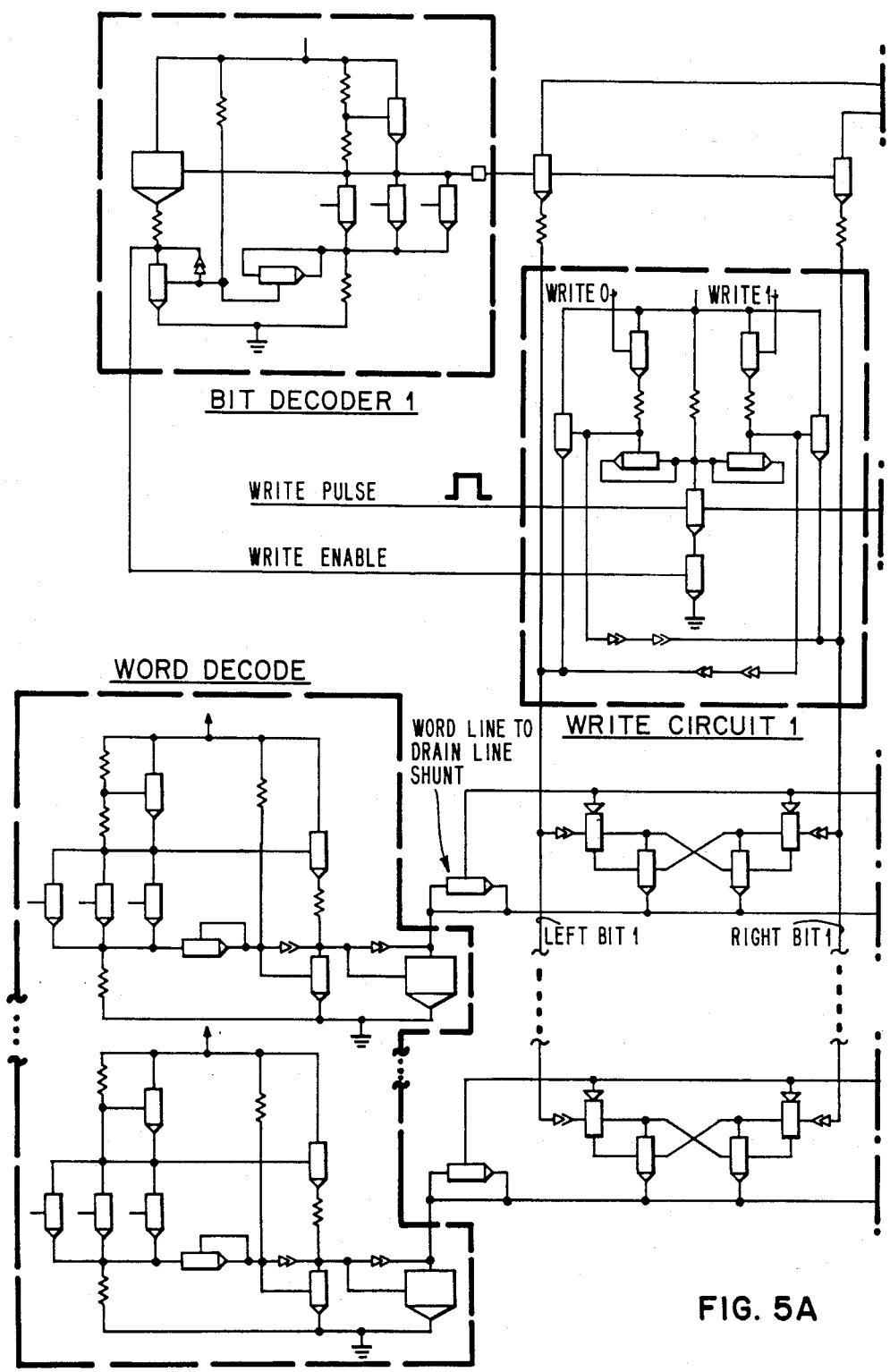
Figure 6:
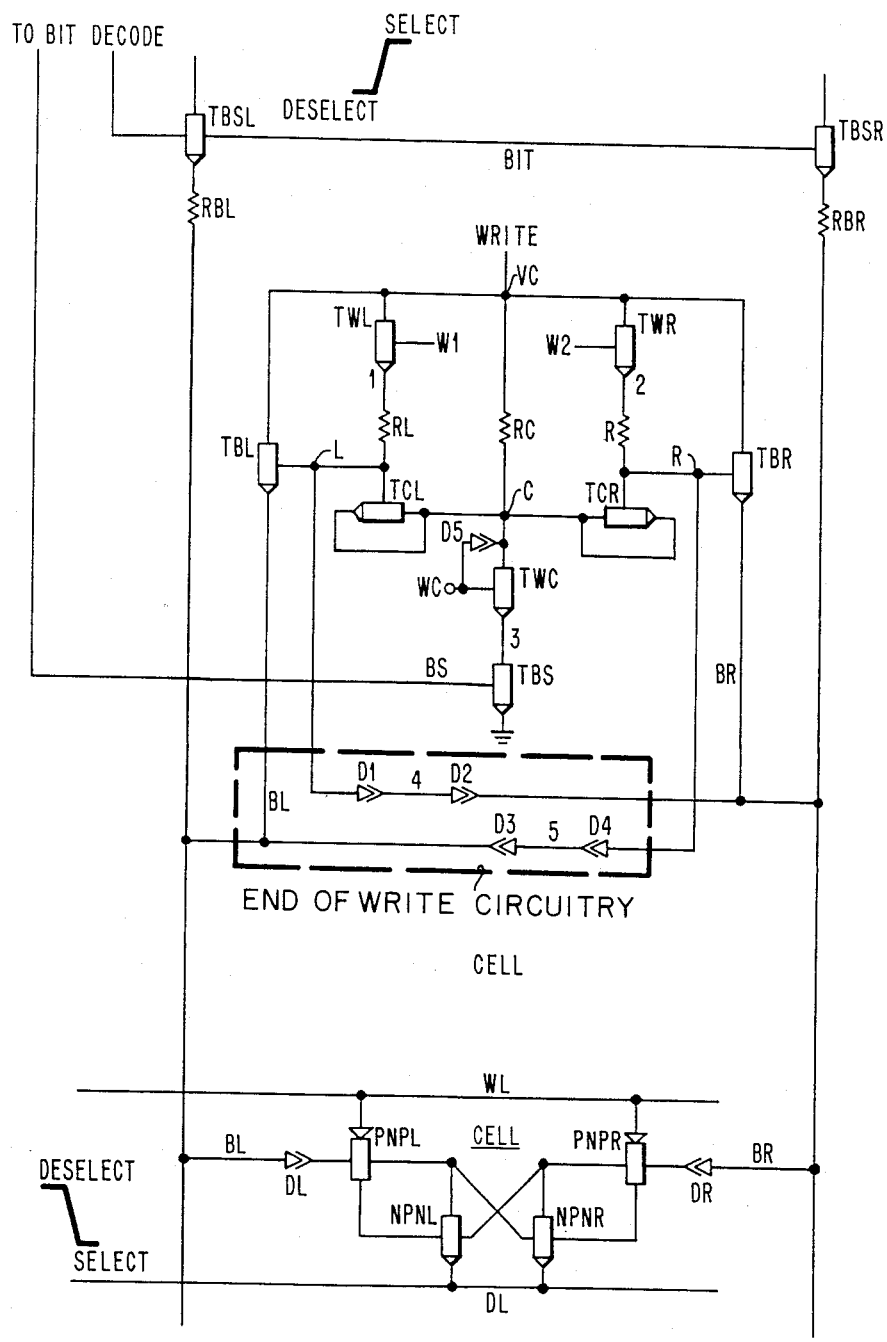
FIG. 6 is a detailed circuit diagram of the write circuit and write complete circuit employed in random access read/write memory array of FIG. 5 and in accordance with the preferred embodiment of the invention.
Figure 7:
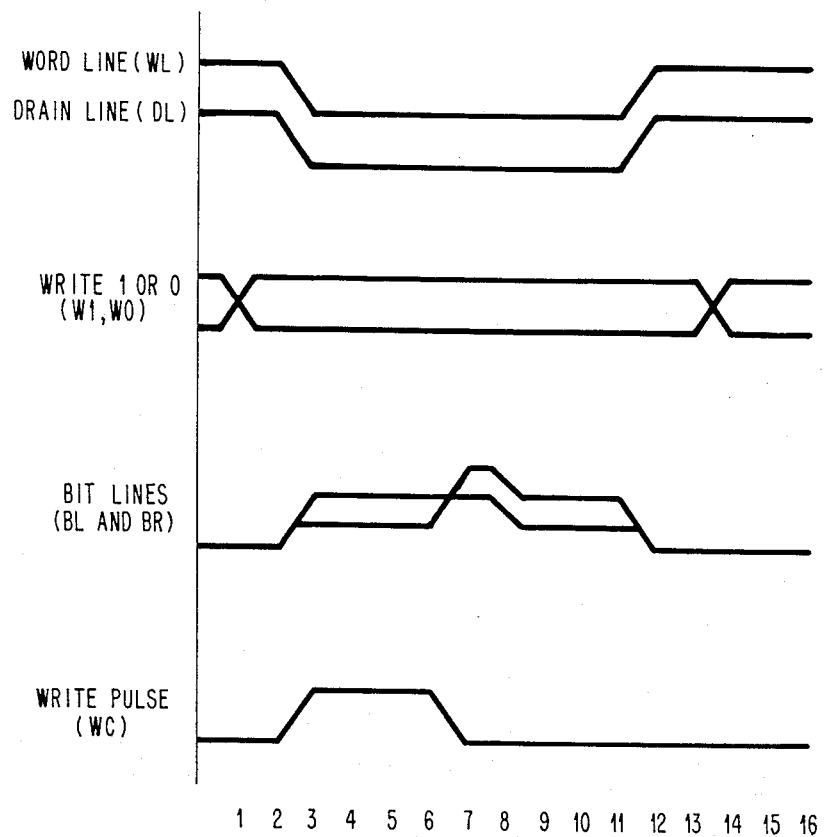
FIG. 7 discloses idealized waveforms to be viewed in conjunction with FIGS. 5 and 6 and the hereinafter explanation the of the "read operation" and the "write operation" of the random access memory array in accordance with the invention.

Refer to FIGS. 6 and 7 during the following explanation of the read and write operation. For a cell to be read or written it must be in a fully selected state, cells in a half selected state are immune from read or write operations. A cell is selected in the word dimension by lowering the voltage on the word and drain line (WL and DL) it is connected to. A cell is selected in the bit dimension by raising the voltage on the bit lines (BL and BR) it is connected to. A cell that is connected to a selected pair of bit lines and selected word/drain lines is fully selected, and its content may be read or altered. Reading the content of a cell is accomplished by sensing a differential voltage or current in the bit lines. For example, if the cell in FIG. 6 contains a "0", which could be defined by transistor NPNL conducting, it could be read by the bit decode circuit raising the voltage of node BIT, and the word decode lowering the voltage of node DL. If NPNL was conducting then in fully selected state collector current would flow thru RBL and DL, the base current for NPNL is supplied thru RBR and DR. Transistor PNPL is slightly conducting while PNPR and NPNR are nonconducting. The differential current that flows in the bit lines is determined by the beta of the NPN transistor in the cell. Typically the beta value is 100 and the voltage difference between the bit lines or the differential current between TBSL and TBSR can easily be sensed.

When the bit decode selects the proper bit column to read, it also does one other thing; it enables the write circuit. If a pulse occurs on the WC line, which is connected to all write circuits, new data will be written into the selected cell. Refer to FIGS. 6 and 7 for an example how a "1" would be written into a cell that contains a "0". The W1 and W0 lines are always out of phase with each other, for the case of writing a "1" the W1 line would be high and W0 low. The cell is brought into the fully selected state by the word and bit decoders. The write circuit is enabled by raising the BS line. The writing is accomplished by a pulse on the WC line. When WC goes high current will flow thru RL and TCL because W1 is high and W0 is low. RL and RR regulate the amount of current thru TCL or TCR. When a PN junction is foward biased it is well known that it stores charge in its depletion layer. This charge is what is used to write the cell. When WC falls transistor TWC turns off. Node C will rise to the positive supply thru resistor RC. The charge that was stored in the base-collector junction of TCL gets coupled onto node L. The rise in voltage of node L turns on transistor TBL and raises the voltage of the left bit line BL above the right bit line BR. It should be noted that this technique will raise node L above the positive supply VC. The cell is written when the rising left bit line becomes high enough to turn on NPNR. At this point in time the current in the bit line swtiches from being the collector current of NPNL to base current of NPNR. The state change of the cell, from 0 to 1, corresponds to an impedance change seen on the bit line by TBL. Because BL is now in a high impedance state there is no good discharge path for node L. If this condition were to remain then the contents of the next selected cell in that bit column could be altered. To remedy that condition diodes D1 and D2 are connected from node L to the opposite bit line that was raised. At the time that BL changed from supplying the collector current of NPNL to supplying the base current of NPNR, BR changed from suppling base current of NPNL to collector current of NPNR. As the current in BR increases its voltage drops to the point where D1 and D2 conduct and discharge node L. The base and colletor currents of NPNR are eventually supplied by transistors TBSL and TBSR respectively as the write circuit shuts itself off. This self limiting feature of the write circuit makes possible high speed write operation and very low power dissipation. It can be appreciated that the write circuit uses power only when the write pulse is high, typically a low duty cycle. At all other times and for all unselected bit columns the write circuit dissipates zero power.

Although the invention has been described with reference to a preferred embodiment, it is understood that the present disclosure has been made only by way of example and that numerous changes may be made without departing from the spirit and scope of the invention.

What is claimed is:

1. In a memory array having a plurality of memory cells connected between a pair of bit lines, said memory array including:
    circuit means connected to said plurality of memory cells for selecting any predetermined one of said plurality of memory cells,
    write circuit means connected to said pair of bit lines for writing data into said selected predetermined one of said plurality of memory cells; and
    "end of write shut down circuit means" connected between the write circuit means and said pair of bit lines, said "end of write circuit means" promptly deactivating said write circuit means upon the completion of the writing of data into said selected predetermined one of said plurality of memory cells.

2. In a memory array having a plurality of memory cells connected between a pair of bit lines, as recited in claim 1, wherein said "end of write shut down circuits means" deactivates said write circuit means at least slightly in anticipation of the completion of the writing of data into said selected predetermined one of said plurality of memory cells.

3. In a memory array having a plurality of memory cells arranged in an array having one through m columns and one through n rows, where m and n are respectively positive integers and said array contains m×n memory cells, said memory array including:
    m pairs of bit lines, each pair of bit lines containing a first bit line and a second bit line, each column of memory cells being associated with a discrete one of said m pairs of bit lines, and each memory cell of each column of memory cells being connected between the first bit line and the second bit line of the pair of bit lines associated with the column of memory cells;
    m pairs of word/drain lines, each pair of word/drain lines containing a word line and a drain line, each row of memory cells being associated with a discrete one of said m pairs of word/drain lines, and each memory cell of each row of memory cells being connected between the word line and drain line of the pair of word/drain lines associated with the row of memory cells;
    m write "0" circuits, each of said m write "0" circuits being connected to the first bit line of a discrete one of said m bit line pairs;
    a first group of m end of write circuits, each of said first group of m end of write circuits being connected between a discrete one of said m write "0" circuits and the second bit line of the bit line pair associated with said discrete one of said m write "0" circuits;
    m write "1" circuits, each of said m write "1" circuits being connected to the second bit line of a discrete one of said m bit line pairs; and
    a second group of m end of write circuits, each of said second group of m end of write circuits being connected between a discrete one of said m write "1" circuits and the first bit line of the bit line pair associated with said discrete one of said m write "1" circuits.

4. In a memory array having a plurality of memory cells, as recited in claim 3, wherein,
    each of said m write "0" circuits includes a write "0" transistor,
    each of said m write "1" circuits includes a write "1" transistor,
    each end of write circuit of said first group of m end of write circuits is connected to the write "0" transistor of the write "0" circuit with which it is associated, and
    each end of write circuit of said second group of m end of write circuits is connected to the write "1" transistor of the write "1" circuit with which it is associated.

5. In a memory array having a plurality of memory cells, as recited in claim 4, wherein each end of write circuit of said first group of m end of write circuits and each end of write circuit of said second group of m end of write circuits respectively comprise essentially unilaterally conductive circuits means.

6. In a memory array, having a plurality of memory cells, as recited in claim 5, wherein each of said unilaterally conductive circuits means consists essentially of at least one diode.

7. In a memory array, having a plurality of memory cells, as recited in claim 5, wherein each of said unilaterally conductive circuit means comprises first and second serially connected Schottky diodes.

8. In a memory array having a plurality of memory cells arranged in an array having one through m columns and one through n rows, where m and n are respectively positive integers and said array contains m×n memory cells, said memory array including:
    m pairs of bit lines, each pair of bit lines containing a first bit line and a second bit line, each column of memory cells being associated with a discrete one of said m pairs of bit lines, and each memory cell of each column of memory cells being connected between the first bit line and the second bit line of the pair of bit lines associated with the column of memory cells;
    n pairs of word/drain lines, each pair of word/drain lines containing a word line and a drain line, each row of memory cells being associated with a discrete one of said n pairs of word/drain lines, and each memory cell of each row of memory cells being connected between the word line and drain line of the pair of word/drain lines associated with the row of memory cells;

m write "0" circuits, each of said m write "0" circuits being associated with a discrete one of said m bit line pairs and connected to the first bit line of said discrete one of said m bit line pairs;

a first group of m end of write circuits, each one of said first group of m end of write circuits being connected between a discrete one of said m write "0" circuits and the second bit line of the bit line pair associated with said discrete one of said m write "0" circuits;

m write "1" circuits, each of said m write "1" circuits being associated with a discrete one of said m bit line pairs and connected to the second bit line of said discrete one of said m bit line pairs;

a second group of m end of write circuits, each one of said second m end of write circuits being connected between a discrete one of said m write "1" circuits and the first bit line of the bit line pair associated with said discrete one of said m write "1" circuits;

word-drain line selection circuit means, said word-drain line selection circuit means in response to receipt of a word-drain line address selecting any predetermined pair of said n pairs of word-drain lines;

bit line pair selection circuit means, said bit line pair selection circuit means in response to receipt of a bit line pair selection address selecting any predetermined pair of said m pairs of bit lines;

controllable circuit means, said controllable circuit means connected to said m write "0" circuits and said m write "1" circuits and cooperating with said word-drain line selection means and said bit-line pair selection circuit means, said controllable circuit means initiating either a "write operation" or a "read operation" whereby during a "write operation" a bit ("1" or "0") will be written (stored) into a selected memory cell and during a read operation a bit ("1" or "0") will be read from a selected memory cell; and sense amplifier circuit means connected to said m pair of bit lines, said sense amplifier electrically manifesting the binary bit ("1" or "0") read during a "read operation".

9. In a memory array having a plurality of memory cells arranged in an array having one through m columns and one thrugh n rows, where m and n are positive integers and said array contains m×n memory cells, as recited in claim 8 wherein each memory cell is a complementary transistor switch (CTS) memory cell.

10. In a memory array having a plurality of memory cells arranged in an array having one through m columns and one through n rows, where m and n are respectively positive integers and said array contains m×n memory cells, as recited in claim 8, wherein each of said memory cells is an unclamped complementary transistor switch (CTS) memory cell, each of said unclamped CTS memory cells comprising, first and second transistors of a first conductivity type, said first and second transistors each having an emitter, base and collector, said emitters of said first and second transistors repectively connected to the drain line of said discrete one of said n pairs of word-drain lines, third and fourth transistors of a second conductivity type, said third and fourth transistors each having an emitter, base and collector, said emitter of said third transistor and said emitter of said fourth transistor being respectively connected to said word line of said discrete one of said n pairs of word-drain lines said collector of said third transistor connected to said base of said first transistor, said base of said third transistor connected in common to said collector of said first transistor and said base of said second transistor, said collector of said fourth transistor connected to said base of said second transistor, said base of said fourth transistor connected in common to said collector of said second transistor and said base of said first transistor, and first and second diodes, said first diode connected between said base of said third transistor and the first bit line of said discrete one of said m pairs of bit lines, and said second diode connected between said base of said fourth transistor and said second bit line of said discrete one of said m pairs of bit lines.

11. In a memory array having a plurality of memory cells arranged in an array having one through m columns and one through n rows, where m and n are respectively positive integers and said array contains m×n unclamped CTS memory cells, as recited in claim 10, wherein said first and second diodes of said unclamped complementary switch (CTS) cell are respectively Schottky diodes.

12. In a memory array having a plurality of memory cells arranged in an array having one through m columns and one through n rows, where m and n are respectively positive integers, and said array contains m×n memory cells, as recited in claim 8, wherein each of said first group of m end of write circuits and each of said second group of m end of write circuits respectively comprises unilaterally conductive circuit means.

13. In a memory array having a plurality of memory cells arranged in an array having one through m columns and one through n rows, where m and n are respectively positive integers, and said array contains m×n memory cells, as recited in claim 12, wherein each of said unilaterally conductive circuits means comprises at least one diode.

14. In a memory array having a plurality of memory cells arranged in an array having one through m columns and one through n rows, where m and n are respectively positive integers, and said array contains m×n memory cells, as recited in claim 12, wherein each of said unilaterally conductive circuit means comprises first and second serially connected Schottky diodes.

15. In a memory array having a plurality of memory cells arranged in an array having one through m columns and one through n rows, where m and n are respectively positive integers and said array contains m×n memory cells, as recited in claim 14, wherein said word-drain line selection circuit means includes n identical write enhancement circuit means for enhancing the "write operation" of said memory array, each of said n identical write enhancement circuit means being a two-terminal device and each of said n identical circuit means being connected between the word line and the drain of a discrete one of said n pairs of word-drain lines.

16. In a memory array having a plurality of memory cells arranged in an array having one through m columns and one through n rows, where m and n are respectively positive integers and said array contains m×n memory cells, as recited in claim 15, wherein each of said n identical write enhancement circuit means is a two terminal unilaterally conductive device.

17. In a memory array having a plurality of memory cells arranged in an array having one through m columns and one through n rows, where m and n are respectively positive integers and said array contains m×n memory cells, as recited in claim 16, wherein each of said n unilaterally conductive devices is a diode.

18. In a memory array having a plurality of memory cells arranged in an array having one through m columns and one through n rows, where m and n are respectively positive integers and said array contains m×n memory cells, as recited in claim 15, wherein each of said n identical write enhancement circuit means is a pn diode.

19. In a memory array having a plurality of memory cells arranged in an array having one through m columns and one through n rows, where m and n are respectively positive integers, and said array contains m×n memory cells, as recited in claim 15, wherein each of said n identical write enhancement circuit means is a diode connected transistor.

20. In a memory array having a plurality of memory cells arranged in an array having one through m columns and one through n rows, where m and n are respectively positive integers, and said array contains m×n memory cells, as recited in claim 15, wherein each of said n identical write enhancement circuit means is a two terminal device comprising a first terminal connected to the base of a transistor and a second terminal connected in common to the collector and emitter of said transistor.

* * * * *